United States Patent
Takezawa et al.

(10) Patent No.: US 12,351,904 B2
(45) Date of Patent: Jul. 8, 2025

(54) FILM DEPOSITION METHOD AND METHOD FOR FORMING POLYCRYSTALLINE SILICON FILM

(71) Applicant: Tokyo Electron Limited, Tokyo (JP)

(72) Inventors: Yoshihiro Takezawa, Yamanashi (JP); Tatsuya Miyahara, Yamanashi (JP); Daisuke Suzuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 115 days.

(21) Appl. No.: 18/051,566

(22) Filed: Nov. 1, 2022

(65) Prior Publication Data
US 2023/0151480 A1  May 18, 2023

(30) Foreign Application Priority Data

Nov. 12, 2021 (JP) .................. 2021-184977

(51) Int. Cl.
| | | |
|---|---|---|
| *C23C 16/24* | (2006.01) | |
| *C30B 25/10* | (2006.01) | |
| *C30B 25/20* | (2006.01) | |
| *C30B 29/06* | (2006.01) | |

(52) U.S. Cl.
CPC .............. *C23C 16/24* (2013.01); *C30B 25/10* (2013.01); *C30B 25/20* (2013.01); *C30B 29/06* (2013.01)

(58) Field of Classification Search
CPC ... C23C 16/0272; C23C 16/045; C23C 16/24; C23C 16/46; C23C 16/56; C30B 25/10; C30B 25/20; C30B 29/06
See application file for complete search history.

(56) References Cited

U.S. PATENT DOCUMENTS

| | | | |
|---|---|---|---|
| 6,764,916 B1* | 7/2004 | Furukawa | H01L 21/02271 438/398 |
| 2003/0219936 A1* | 11/2003 | Kim | H01L 21/02532 438/945 |
| 2005/0087792 A1* | 4/2005 | Kondo | H01L 21/0262 257/314 |
| 2005/0158945 A1* | 7/2005 | Birner | H01L 29/945 257/E21.396 |
| 2006/0046364 A1* | 3/2006 | Chang | H01L 29/66734 438/197 |
| 2010/0240172 A1* | 9/2010 | Rana | H01L 31/022441 438/96 |
| 2014/0349468 A1* | 11/2014 | Suzuki | H01L 21/0245 438/479 |
| 2018/0373140 A1* | 12/2018 | Yanase | G03F 1/64 |

FOREIGN PATENT DOCUMENTS

JP  2015-115435  6/2015

* cited by examiner

*Primary Examiner* — Matthew J Song
(74) *Attorney, Agent, or Firm* — IPUSA, PLLC

(57) ABSTRACT

A film deposition method includes depositing an amorphous silicon film in a substrate under a process condition. The process condition includes supplying $SiH_4$ gas into a processing chamber in which the substrate is placed. The process condition includes setting a temperature in the processing chamber to be in a range of greater than or equal to 300° C. and less than or equal to 440° C. The process condition includes setting a pressure of the processing chamber to be in a range of greater than or equal to 10 Torr and less than or equal to 100 Torr.

8 Claims, 5 Drawing Sheets

FILM DEPOSITION METHOD AND METHOD FOR FORMING POLYCRYSTALLINE SILICON FILM

CROSS-REFERENCE TO RELATED APPLICATIONS

This patent application claims priority to Japanese Patent Application No. 2021-184977, filed Nov. 12, 2021, the contents of which are incorporated herein by reference in their entirety.

TECHNICAL FIELD

The present disclosure relates to a film deposition method and a method for forming a polycrystalline silicon film.

BACKGROUND

A technique is known in which an amorphous silicon film, which is doped with impurities that suppress the progress of crystallization, as well as a non-doped amorphous silicon film, are laminated in this order so as to be situated on and above an insulating film, and then the laminated amorphous silicon films are crystallized (see, for example, Patent Document 1).

RELATED-ART DOCUMENT

Patent Document

[Patent Document 1] Japanese Unexamined Patent Application Publication No. 2015-115435

SUMMARY

One aspect of the present disclosure relates to a film deposition method. The film deposition method includes depositing an amorphous silicon film in a substrate under a process condition. The process condition includes supplying $SiH_4$ gas into a processing chamber in which the substrate is placed. The process condition includes setting a temperature in the processing chamber to be in a range of greater than or equal to 300° C. and less than or equal to 440° C. The process condition includes setting a pressure of the processing chamber to be in a range of greater than or equal to 10 Torr and less than or equal to 100 Torr.

DETAILED DESCRIPTION

One or more embodiments of the present disclosure will be described below with reference to the drawings. In each of the drawings, the same components are denoted by the same numerals, and accordingly, duplicate description will be omitted.

Figure 1:
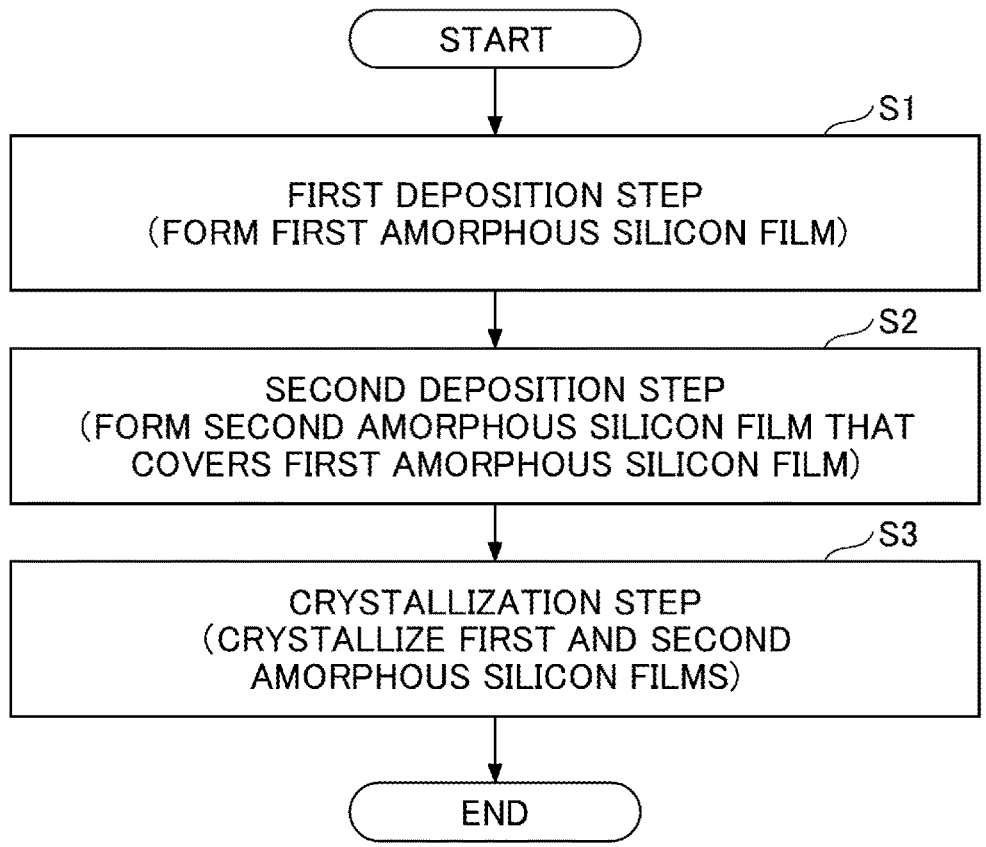
FIG. 1 is a flowchart illustrating a method for forming a polycrystalline silicon film according to one embodiment.

As illustrated in FIG. 1, a method for forming a polycrystalline silicon film according to one embodiment disclosure includes sequentially performing a first deposition step S1, a second deposition step S2, and a crystallization step S3. A film deposition method according to one embodiment relates to a deposition process in the first deposition step S1.

Figure 2:
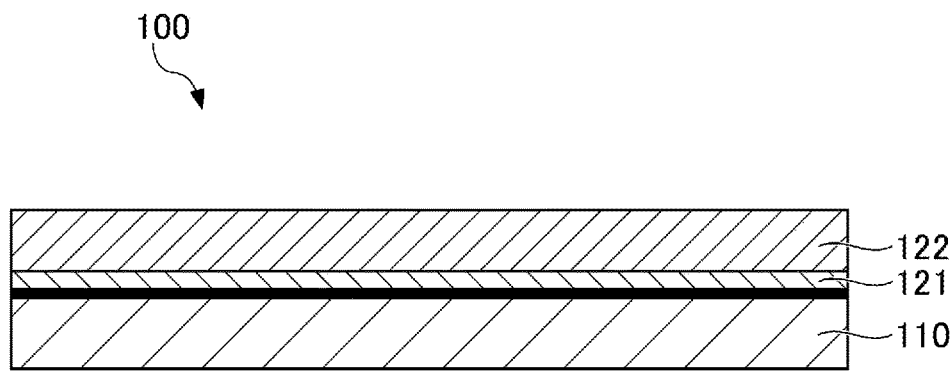
FIG. 2 is a schematic cross-sectional view of a substrate after a second deposition step.

As illustrated in FIG. 2, a substrate 100 for which the method for forming a polycrystalline silicon film is performed is, for example, a semiconductor wafer applied to a memory such as a VNAND. The substrate 100 may be used for a purpose other than the memory.

The substrate 100 includes an insulating film (base layer) 110 on a surface of the substrate 100. The insulating film 110 insulates a gate in a memory. Examples of the insulating film 110 include a silicon oxide film ($SiO_2$ film), a silicon nitride film (SiN film), and the like. In the method for forming a polycrystalline silicon film, an amorphous silicon film is deposited on the insulating film 110. When the amorphous silicon film is formed, the surface of the insulating film 110 is preferably coated with organic silane such as aminosilane.

In the second deposition step S2, the first amorphous silicon film (seed layer 121) and the second amorphous silicon film (bulk layer 122) are laminated on and above the insulating film 110. That is, in the method for forming a polycrystalline silicon film, the seed layer 121 is deposited on the insulating film 110 in the first deposition step S1, and the bulk layer 122 is deposited on the seed layer 121 in the second deposition step S2.

In the crystallization step S3, the seed layer 121 and the bulk layer 122 are crystallized by heating the substrate 100 that includes the seed layer 121 and the bulk layer 122 to a predetermined temperature. With this approach, in the substrate 100, a polycrystalline silicon film is formed on the insulating film 110.

Hereafter, an example of a processing apparatus 1 that performs the method for forming a polycrystalline silicon film will be described with reference to FIG. 3. The processing apparatus 1 is a batch-type apparatus that performs a process in which substrates 100 each of which includes the insulating film 110 are processed at the same time.

The processing apparatus 1 includes a processing chamber 10, a gas supply 30, an exhaust device 40, a heater 50, a controller 80, and the like.

An interior of the processing chamber 10 can be depressurized, and the processing chamber 10 accommodates substrates 100. The processing chamber 10 includes a cylindrical inner tube 11. The inner tube 11 has a lower end that is open and has a ceiling. The processing chamber 10 also includes a cylindrical outer tube 12 that covers the outer side of the inner tube 11. The lower end of the outer tube 12 is open and the outer tube 12 has a ceiling. The inner tube 11 and the outer tube 12 are each formed of a heat-resistant material such as quartz, and are coaxially arranged to form a double tube structure.

The ceiling of the inner tube 11 is flat, for example. An accommodation portion 13 that accommodates a gas nozzle along the longitudinal direction (vertical direction) of the inner tube 11 is formed at one side of the inner tube 11. The accommodation portion 13 is a region portion of a protruding portion 14 that is formed by protruding a portion of a sidewall of the inner tube 11 toward the outside.

A rectangular opening 15 is formed at the sidewall of the inner tube 11 on an opposite side of the inner tube 11 from the accommodation portion 13, so as to be along the longitudinal direction (vertical direction) of the inner tube 11.

The opening 15 is a gas exhaust port formed so as to be capable to exhaust the gas in the inner tube 11. The opening 15 has the same length as a length of a wafer boat 16, or extends in both the upper and lower directions to be longer than the length of the wafer boat 16.

A lower end of the processing chamber 10 is supported by a cylindrical manifold 17 made of, for example, stainless steel. A flange 18 is formed on an upper end of the manifold 17, and a lower end of the outer tube 12 is provided to be supported on the flange 18. A sealing member 19, such as an O-ring, is interposed between the flange 18 and the lower end of the outer tube 12 so that an interior of the outer tube 12 is hermetically sealed.

An annular support 20 is provided at an inner wall of the upper portion of the manifold 17, and the lower end of the inner tube 11 is provided to be supported on the support 20. A cover 21 is hermetically attached to an opening at the lower end of the manifold 17 through the sealing member 22 such as an O-ring, so as to hermetically close the opening at the lower end of the processing chamber 10, that is, the opening of the manifold 17. The cover 21 is made of stainless steel, for example.

A rotation shaft 24, which rotatably supports the wafer boat 16 through a magnetic fluid sealing portion 23, is provided at the central portion of the cover 21 to pass through the cover 21. A lower portion of the rotation shaft 24 is rotatably supported by an arm 25A of an elevation mechanism 25 that includes a boat elevator.

A rotation plate 26 is provided at an upper end of the rotation shaft 24, and the wafer boat 16 that holds the substrates 100 is provided above the rotation plate 26, via a heated platform 27 made of quartz. With this arrangement, the cover 21 and the wafer boat 16 are integrally moved up and down by raising and lowering the elevation mechanism 25. Thus, the wafer boat 16 can be inserted into or removed from the processing chamber 10. The wafer boat 16 can be accommodated by the processing chamber 10 and substantially horizontally holds a plurality of (for example, 50 to 150) substrates 100, such that the substrates 100 are spaced apart from one another when viewed in the vertical direction.

The gas supply 30 includes a gas nozzle 31 via which process gas and purge gas are supplied into the inner tube 11 in each of the first deposition step S1 and the second deposition step S2. As the process gas, monosilane ($SiH_4$) gas that is a silicon-containing gas is used, and as the purge gas, for example, nitrogen gas ($N_2$) or argon gas (Ar) can be used.

The gas nozzle 31 is made of, for example, quartz, and is provided in the inner tube 11 along a longitudinal direction of the inner tube 11. Also, a base end of the gas nozzle 31 is bent in an L-shape, and is supported so as to pass through the manifold 17. Gas holes 32 are formed at the gas nozzle 31 along the longitudinal direction of the gas nozzle 31, and the process gas is horizontally discharged via the gas holes 32. The gas holes 32 are arranged at the same intervals as intervals of the substrates 100 that are supported by the wafer boat 16, for example. The process gas of which a flow rate is controlled is introduced into the gas nozzle 31.

Figure 3:
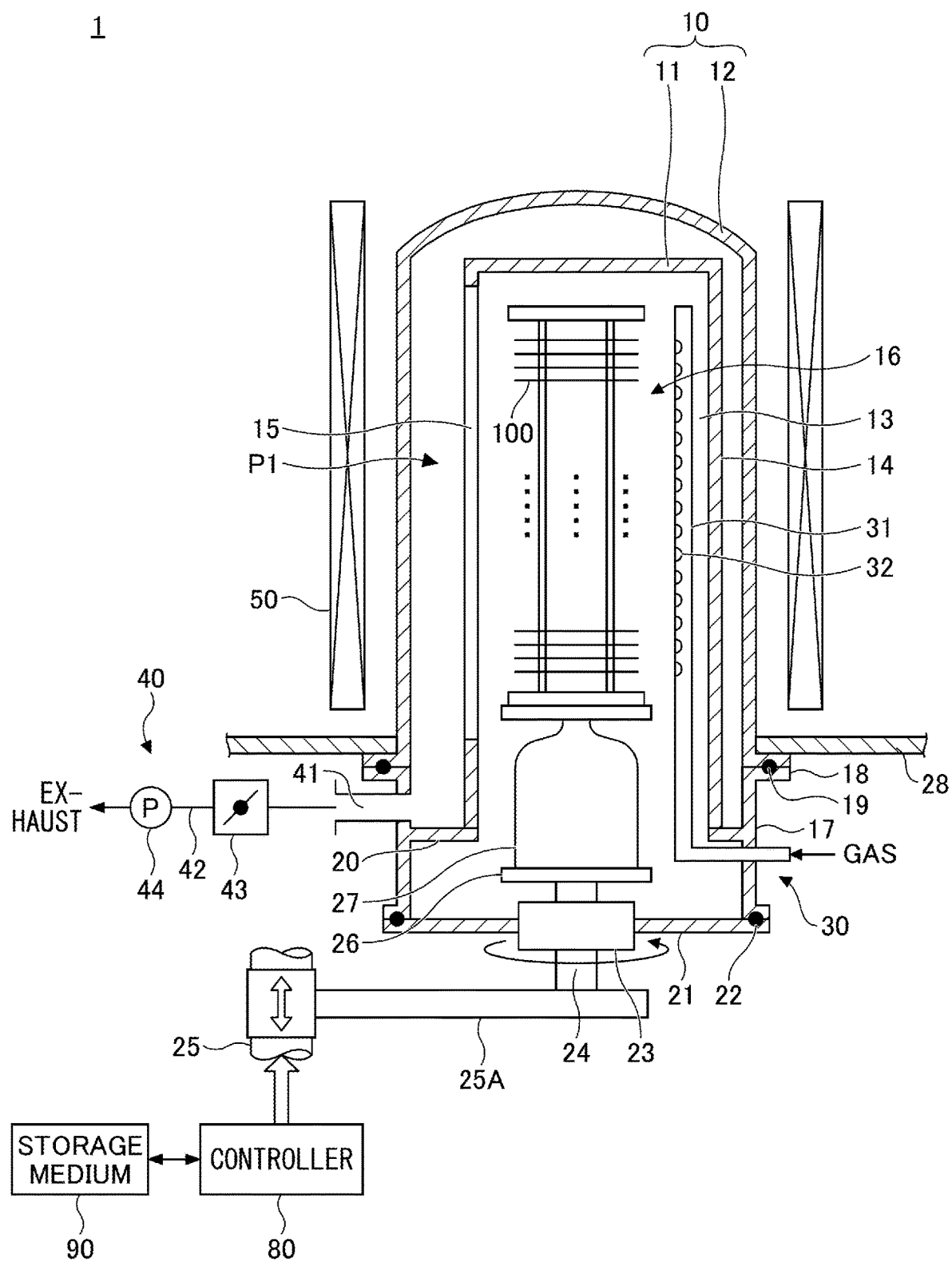
FIG. 3 is a schematic diagram of an example of a processing apparatus that performs the method for forming a polycrystalline silicon film.

Although FIG. 3 illustrates a case where the gas supply 30 includes one gas nozzle 31, the gas supply 30 is not limited to the manner described above. For example, the gas supply 30 may include gas nozzles. For example, the monosilane gas and the purge gas may be respectively supplied into the inner tube 11 from different gas nozzles.

The exhaust device 40 exhausts the gas discharged from the interior of the inner tube 11, through the opening 15. Also, the exhaust device 40 exhausts the gas discharged from a gas outlet 41, through a space P1, which is between the inner tube 11 and the outer tube 12. The gas outlet 41 is formed at the sidewall of the upper portion of the manifold 17 so as to be situated above the support 20. An exhaust passage 42 is connected to the gas outlet 41. A pressure regulating valve 43 and a vacuum pump 44 are separately provided downstream of the exhaust passage 42 to allow an internal pressure of the processing chamber 10 to be adjusted.

The heater 50 is provided to enclose a periphery of the outer tube 12. The heater 50 is fixed, for example, above the base plate 28. The heater 50 has a cylindrical shape so as to cover the outer tube 12. The heater 50 includes, for example, a heating element, and heats the substrates 100 in the processing chamber 10.

The controller 80 controls the operation of each component of the processing apparatus 1. The controller 80 may be implemented, for example, by a computer that includes one or more processors, a memory, an input-and-output interface, and an electronic circuit that are not illustrated. Each processor includes a combination of one or more among a central processing unit (CPU), an application specific integrated circuit (ASIC), a field programmable gate array (FPGA), a circuit constituted by discrete semiconductors, and the like. The memory includes a volatile memory and a non-volatile memory. The memory also includes a storage medium 90 (for example, a compact disk, a digital versatile disc (DVD), a hard disk, a flash memory, or the like) coupled to the controller 80. A program, which causes the processing apparatus 1 to operate, and a recipe (process condition) for a substrate process are stored in the storage medium 90.

Hereafter, the operation of the processing apparatus 1 will be described. The controller 80 controls the operation of each component of the processing apparatus 1 to perform the method for forming a polycrystalline silicon film, as follows.

First, in the substrate process in the processing apparatus 1, the wafer boat 16 on which the substrates 100 are mounted is transferred to the processing chamber 10. Next, the opening at the lower end of the manifold 17 is closed by the cover 21, and thus the interior of the processing chamber 10 forms a sealed space.

After forming the sealed space, the processing apparatus 1 performs the first deposition step S1. In the first deposition step S1 according to the present embodiment, the deposition process for each substrate 100 is performed under the following process condition.

Processing gas: monosilane ($SiH_4$) gas
Temperature in processing chamber 10: greater than or equal to 300° C. and less than or equal to 440° C.
Pressure of processing chamber 10: greater than or equal to 10 Torr (i.e., about 1.3 kPa) and less than or equal to 100 Torr (i.e., about 13 kPa)
Flow rate of process gas: greater than or equal to 0.1 slm and less than or equal to 3 slm That is, in the processing apparatus 1, a thermal decomposition temperature of the monosilane gas in the first deposition step S1 is set to a temperature (300° C. to 440° C.) less than a thermal decomposition temperature (450° C. to 530° C.) generally used in a conventional deposition process. The thermal decomposition temperature of the monosilane gas in the first deposition step S1 is less than a thermal decomposition temperature of the monosilane gas in the second deposition step S2 described below.

Figure 4A:
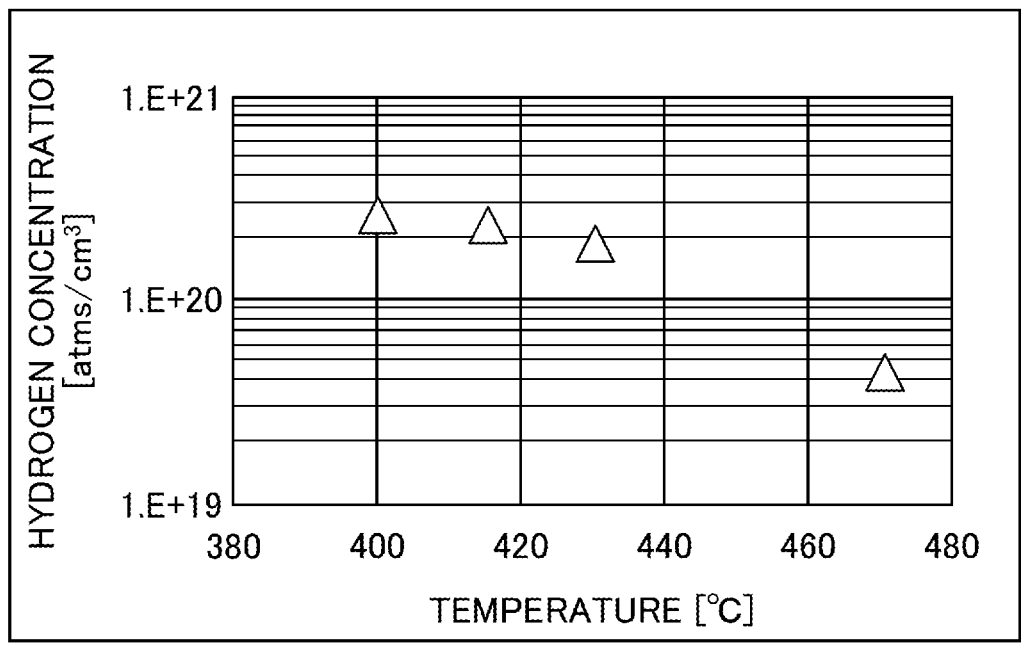
FIG. 4A is a graph indicating the relationship between a temperature in a processing chamber and a hydrogen concentration in a film in a deposition process.

FIG. 4A is a logarithmic graph indicating the relationship of a hydrogen concentration in a film that constitutes the seed layer 121 to the temperature in the processing chamber 10 in the first deposition step S1. On the graph, the horizontal axis represents the temperature in the processing chamber 10, and the vertical axis represents the hydrogen concentration in the film. As can be seen from this graph, in the deposition process that uses the monosilane gas, the hydrogen concentration in the film increases as the temperature in the processing chamber 10 decreases. That is, by performing the deposition process in an environment in which a thermal decomposition temperature of the monosilane gas is reduced, more hydrogen contained in the monosilane gas remains in the seed layer 121.

With this approach, when the hydrogen concentration in the film is increased, in a case where crystallization is carried out in the crystallization step S3, a polycrystalline silicon film having a large grain size can be formed due to desorption of hydrogen. In other words, in the first deposition step S1, the seed layer 121 is formed by heating the substrate 100 at a temperature in the range of greater than or equal to 300° C. and less than or equal to 440° C., thereby facilitating increases in the grain size of the polycrystalline silicon film.

The processing apparatus 1 performs the deposition process, while maintaining the pressure of the processing chamber 10 at high pressure, in order to suppress reductions in a particle size of silicon nucleus in the seed layer 121 due to the reduced thermal decomposition temperature of the monosilane gas in the first deposition step S1. Specifically, as specified in the above process condition, the processing apparatus 1 sets the pressure of the processing chamber 10 in the first deposition step S1 to a pressure (e.g., 10 Torr to 100 Torr) greater than a pressure (5 Torr or less, i.e., about 667 Pa or less) generally used in the conventional deposition process. The pressure of the processing chamber 10 in the first deposition step S1 is greater than the pressure of the processing chamber 10 in the second deposition step S2 described below.

Figure 4B:
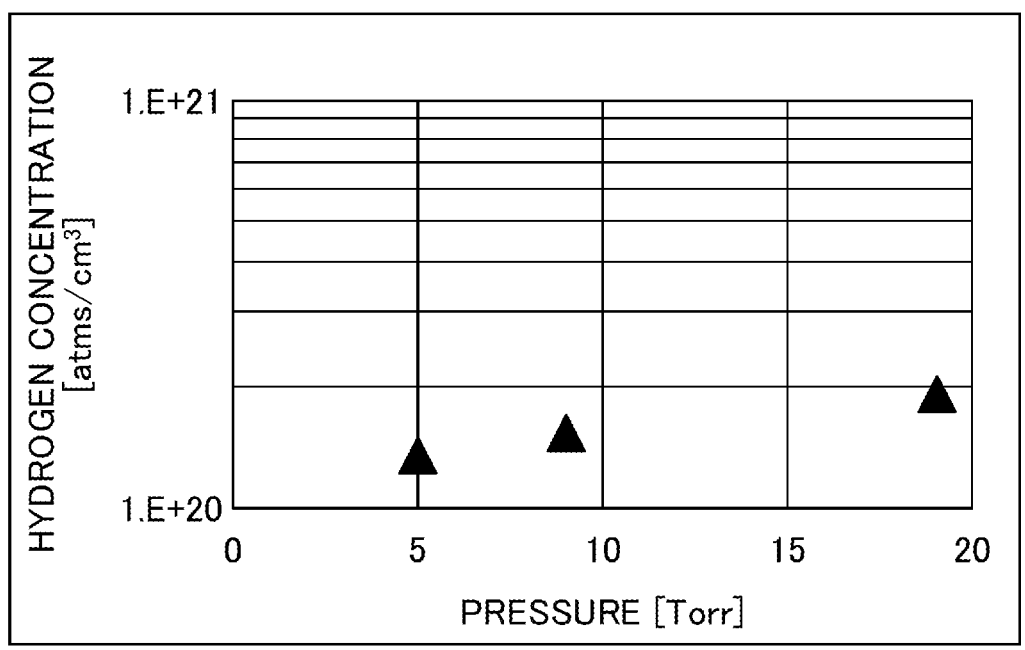
FIG. 4B is a graph indicating the relationship between a pressure of the processing chamber and the hydrogen concentration in the film in the deposition process.

FIG. 4B is a logarithmic graph indicating the relationship of the hydrogen concentration in a film that constitutes the seed layer 121 to the pressure of the processing chamber 10, in a case where the temperature in the processing chamber 10 is 430° C. On the graph, the horizontal axis represents the pressure of the processing chamber 10, and the vertical axis represents the hydrogen concentration in the film. As can be seen from this graph, in the deposition process that uses the monosilane gas, when the temperature in the processing chamber 10 stays constant, the hydrogen concentration in the film increases as the pressure of the processing chamber 10 increases. That is, by performing the deposition process in an environment in which the pressure of the processing chamber 10 is increased, more hydrogen contained in the monosilane gas remains in the seed layer 121.

In order to maintain the pressure of the processing chamber 10 at a constant level, the processing apparatus 1 preferably sets a flow rate of the monosilane gas that the gas supply 30 supplies into the processing chamber 10, to be in the range of 0.1 slm to 3 slm. With this approach, the processing apparatus 1 can stably supply the monosilane gas onto each substrate 100 that is placed in the processing chamber 10, thereby enabling the deposition of the seed layer 121 to progress.

In order to satisfy the process condition in the first deposition step S1, the controller 80 controls the exhaust device 40 to vacuum-evacuate the interior of the processing chamber 10 to thereby maintain the interior of the processing chamber 10 at a predetermined pressure (for example, 19 Torr) in the range of greater than or equal to 10 Torr and less than equal to 100 Torr, as specified in the process condition. The controller 80 also controls the power supplied to the heater 50 to increase the temperature in the processing chamber 10 to a predetermined temperature (for example, 380° C.) in the range of greater than or equal to 300° C. and less than or equal to 440° C., as specified in the process condition.

When the pressure of the processing chamber 10 is stabilized at a predetermined pressure and the temperature in the processing chamber 10 is stabilized at a predetermined temperature, monosilane gas is supplied into the processing chamber 10. For a supplied amount of the monosilane gas, a predetermined flow rate (for example, 0.3 slm) is set in the range of greater than or equal to 0.1 slm and less than or equal to 3 slm, as specified in the process condition. In the processing apparatus 1, the wafer boat 16 may rotate in response to supplying of the monosilane gas. The processing apparatus 1 performs the above deposition process over any process time.

With this approach, the processing apparatus 1 can deposit the first amorphous silicon film (seed layer 121) having a uniform film thickness on the insulating film 110. When the seed layer 121 having a desired film thickness is formed, the processing apparatus 1 terminates the first deposition step S1. The processing apparatus 1 continues to rotate the wafer boat 16 even after the first deposition step S1 is terminated.

Subsequently, the processing apparatus 1 performs the second deposition step S2. In the second deposition step S2, the deposition process for each substrate 100 is performed under the following process condition.

Process gas: silicon-containing gas

Temperature in processing chamber 10: greater than 450° C. and less than or equal to 530° C.

Pressure of the processing chamber 10: 5 Torr (i.e., about 1.3 kPa) or less

Flow rate of process gas: greater than or equal to 0.1 slm and less than or equal to 5 slm As the silicon-containing gas in the second deposition step S2, for example, monosilane gas, a high order silane gas, a halogen-containing silicon gas, or a mixture gas of two or more among the monosilane gas, the high order silane gas, and the halogen-containing silicon gas can be used. Examples of the halogen-containing silicon gas include (i) a fluorine-containing silicon gas such as $SiF_4$, $SiHF_3$, $SiH_2F_2$, or $SiH_3F$, (ii) a chlorine-containing silicon gas such as $SiCl_4$, $SiHCl_3$, $SiH_2Cl_2$ (DCS), or $SiH_3Cl$, and (iii) a bromine-containing gas such as $SiBr_4$, $SiHBr_3$, $SiH_2Br_2$, or $SiH_3Br$. As the silicon-containing gas in the second deposition step S2 according to the present embodiment, monosilane gas is applied from the viewpoint of an increased deposition rate and low costs.

When the process shifts from the first deposition step S1 to the second deposition step S2, the processing apparatus 1 continues to supply the monosilane gas into the processing chamber 10 while continuing to rotate the wafer boat 16.

Then, the processing apparatus 1 changes from the pressure of the processing chamber 10 in the first deposition step S1, to a predetermined pressure in the range of 5 Torr or less, as specified in the process condition used in the second deposition step S2. The processing apparatus 1 also adjusts the power supplied to the heater 50 to adjust the temperature in the processing chamber 10 to a predetermined temperature (for example, 470° C.) in the range of greater than or equal to 450° C. and less than or equal to 530° C., which is specified in the process condition.

Then, the processing apparatus 1 performs the second deposition step S2 over any process time, in a state where the pressure of the processing chamber 10 is stabilized at a given pressure specified in the second deposition step S2 and the temperatures of the processing chamber 10 is stabilized at a given temperature specified in the second deposition step S2. With this approach, the bulk layer 122 that covers the seed layer 121 is formed. After the seed layer 121 is entirely covered with the bulk layer 122, supplying of the monosilane gas into the processing chamber 10 is stopped. The processing apparatus 1 continues to rotate the wafer boat 16 even after the second deposition step S2 is terminated.

Finally, the processing apparatus 1 performs the crystallization step S3. At this time, in the processing apparatus 1, the interior of the processing chamber 10 is subject to an inert gas atmosphere. The inert gas atmosphere may be, for example, a nitrogen atmosphere or an argon atmosphere. Instead of the inert gas atmosphere, a reducing gas atmosphere such as a hydrogen atmosphere may be used. In the present embodiment, although the crystallization step S3 is performed by the same apparatus as a given apparatus that performs the first deposition step S1 and the second deposition step S2, such a manner is not limiting. The crystallization step S3 may be performed by a different apparatus from the given apparatus that performs the first deposition step S1 and the second deposition step S2.

In the processing apparatus 1, the temperature in the processing chamber is adjusted to a given temperature in the crystallization step S3, by adjusting the power supplied to the heater 50. The given temperature in the crystallization step S3 may be a predetermined temperature (for example, 650° C.) in the range of greater than or equal to 550° C. and less than or equal to 700° C. With this approach, crystallization of the seed layer 121 and the bulk layer 122 progresses. As described above, in the present embodiment, the seed layer 121 is formed in a low temperature and high pressure environment, and thus silicon in the seed layer 121 is nucleated significantly, and thus the nucleated silicon causes the bulk layer 122 to be crystallized. With this approach, the polycrystalline silicon film having a large grain size can be formed.

Figure 5A:
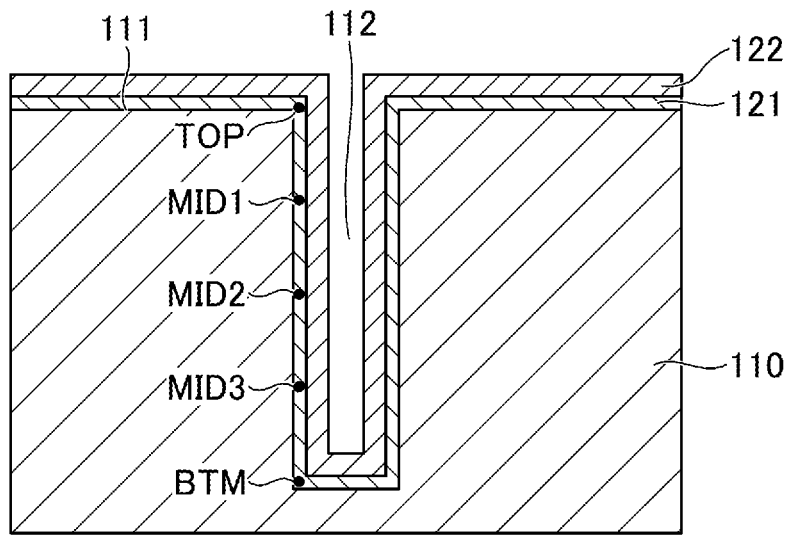
FIG. 5A is a cross-sectional view of an example of a seed layer and a bulk layer in a recess formed in the deposition process according to one embodiment.

As illustrated in FIG. 5A, the deposition process in the first deposition step S1 according to the present embodiment is particularly effective for the insulating film 110 that includes (i) a flat portion 111 that is flat and continuous along a plane of the substrate 100 and (ii) a recess 112 recessed from the flat portion 111 in a thickness direction of the substrate 100. The recess 112 in the insulating film 110 may include a hole, a trench, or the like. In each of FIG. 5A and FIG. 5B below, positions TOP, MID1, MID2, MID3, and BTM, which are each marked at a location among seed layers 121 and 221 present in recesses 112, indicate measurement positions where film thicknesses of a given film are measured, and each measurement position is set along a depth direction of a given recess 112. TOP is the measurement position where the film thickness is measured around an opening of a given recess 112, and BTM is the measurement position where the film thickness is measured proximal to an bottom of the given recess 112. MID1, MID2, and MID3 are measurement positions where film thicknesses are measured, and those measurement positions are set at intervals in this order, when viewed in the direction from the TOP to the BTM.

In the deposition process according to the present embodiment, the seed layer 121 is formed on the insulating film 110 by using the monosilane gas, thereby allowing increased coverage for coating of the recess 112, as illustrated in FIG. 5A. In other words, each of the above film deposition method and the method for forming a polycrystalline silicon film can form the seed layer 121 having a uniform film thickness on an inner surface of the recess 112 and along the depth direction of the recess 112.

Figure 5B:
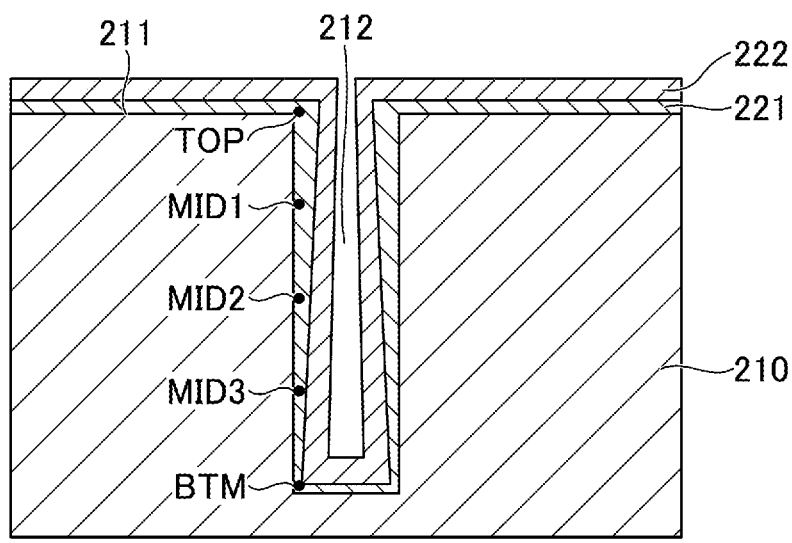
FIG. 5B is a cross-sectional view of the seed layer and the bulk layer in the recess formed in a conventional deposition process.

In contrast, in the conventional deposition process, as illustrated in FIG. 5B, a seed layer 221 is formed on an insulating film 210 using a high order silane gas such as disilane ($Si_2H_6$) gas. The disilane gas does not easily enter a deep portion of a recess 212, and consequently coverage for the coating of the recess 212 is decreased. With this arrangement, the disilane gas forms the seed layer 221 that is thin, when viewed from an opening (TOP-side) of the recess 212 toward a bottom (BTM-side) thereof.

Figure 5C:
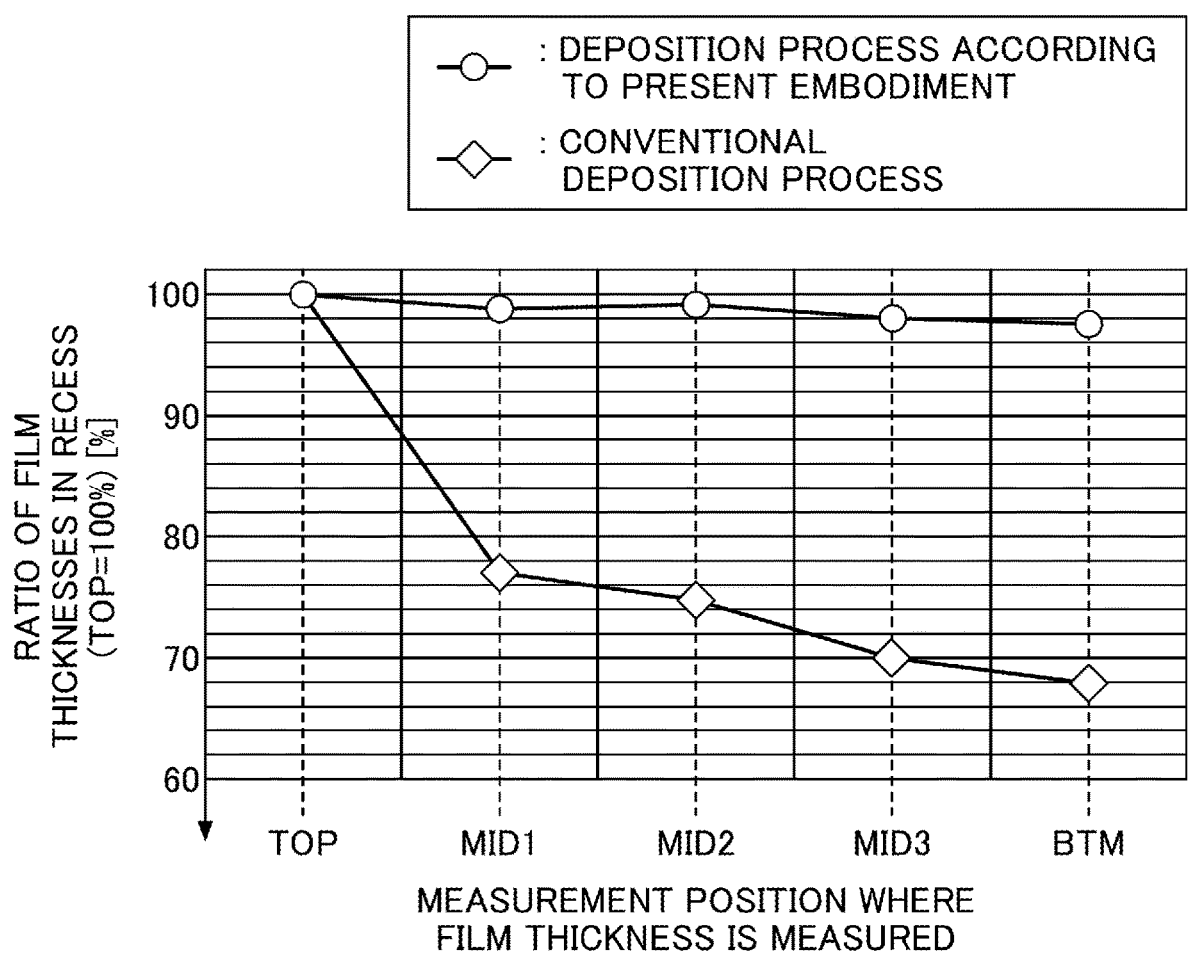
FIG. 5C is a graph indicating a comparison of film thicknesses of the seed layer formed in the recess.

Specifically, when the film thickness of the seed layer 121, which is obtained in the deposition process according to the present embodiment, is compared with the film thickness of the seed layer 221, which is obtained in the conventional deposition process, a comparison result is as illustrated in FIG. 5C. On the graph in FIG. 5C, TOP, MID1, MID2, MID3, and BTM on the horizontal axis respectively correspond to TOP, MID1, MID2, MID3, and BTM in each of FIGS. 5A and 5B. Also, on the graph in FIG. 5C, the vertical axis represents a ratio (which indicates a ratio of film thicknesses) of a given film thickness at each given measurement position, to a given film thickness at TOP, with respect to each of the recesses 112 and 212.

As illustrated in FIG. 5C, for the seed layer 221 formed in the conventional deposition process, a ratio of a given film thickness at BTM to a given film thickness at TOP was 67.9%. With this arrangement, the thickness of the bottom film is reduced, and thus in a subsequent step process, the film thickness of the bulk layer 222, which is laminated on the seed layer 221, may be nonuniform.

In contrast, for the seed layer 121 formed in the deposition process according to the present embodiment, a ratio of a given film thickness at BTM to a given film thickness at TOP was 97.7%. That is, it can be seen that in the deposition process according to the present embodiment, the seed layer 121 having a uniform film thickness is formed on the inner surface of the recess 112, compared to the conventional deposition process. With use of the seed layer 121 having a more uniform film thickness, the bulk layer 122 deposited in the second deposition step S2 is also deposited on the inner surface of the recess 112 to have a more uniform film thickness.

The coverage for the seed layer 121 formed by the film deposition method according to the present embodiment is superior to the coverage for the seed layer 221 formed by the conventional deposition process. With this approach, in the deposition process according to the present embodiment, the film thickness of the seed layer 121 formed on the flat portion 111 can be made uniform, compared to the film thickness of the seed layer 221 formed on a flat portion 211 in the conventional deposition process. Also, the film deposition method according to the present embodiment is not limited to depositing of the seed layer 121, and may be applied to any other deposition in accordance with a purpose such as achieving of a uniform film thickness.

The technical concept and effect described in the above embodiments will be described below.

A first aspect of the present disclosure relates to a film deposition method for forming an amorphous silicon film (seed layer 121) in a substrate 100. The film deposition method includes performing a deposition process under process condition of (a) and (b) below, while supplying monosilane ($SiH_4$) gas into a processing chamber 10 that accommodates the substrate 100.

(a) Setting a temperature in the processing chamber 10 to be in the range of greater than or equal to 300° C. and less than or equal to 440° C.

(b) Setting a pressure of the processing chamber 10 to be in the range of greater than or equal to 10 Torr and less than or equal to 100 Torr.

According to the above aspect, the film deposition method supplies monosilane ($SiH_4$) gas into the processing chamber 10 in a low temperature and high pressure environment. As a result, an amorphous silicon film having a more uniform film thickness can be formed in the substrate 100. With this approach, for example, when the amorphous silicon film to be deposited is the seed layer 121 that is nucleated at an interface portion in the substrate 100, coverage for the seed layer 121 can be increased. Also, in the film deposition method, when the amorphous silicon film is crystallized, the crystallized amorphous silicon film can have a large grain size.

A film deposition process further includes the process condition of (c) below.

(c) Setting a flow rate of monosilane ($SiH_4$) gas supplied into a processing chamber 10 to be in the range of greater than or equal to 0.1 slm and less than or equal to 3 slm.

With this approach, in the film deposition method, even under the above process condition of (a) and (b), monosilane gas can be stably supplied into the processing chamber 10, and thus deposition can be facilitated in the substrate 100.

The substrate 100 has a flat portion 111 that is flat and continuous along a plane of the substrate 100, and in a deposition process, an amorphous silicon film (seed layer 121) is deposited on the flat portion 111. With this approach, in the film deposition method, an amorphous silicon film having a more uniform film thickness can be formed on the flat portion 111.

The substrate 100 further has a recess 112 recessed from a flat portion 111 in a thickness direction of the substrate 100, and in a deposition process, an amorphous silicon film (seed layer 121) is deposited on each of the flat portion 111 and the recess 112. As described above, even when the substrate 100 has the recess 112, in the film deposition method, an amorphous silicon film (seed layer 121) having a more uniform film thickness can be formed on an inner surface of the recess 112 along the thickness direction of the substrate 100, by supplying monosilane gas in a low temperature and high pressure environment.

An insulating film 110 is formed in a substrate 100, and an amorphous silicon film (seed layer 121) is formed on the insulating film 110. With this approach, in a film deposition method, an amorphous silicon film having a more uniform film thickness can be formed on the insulating film 110.

A second aspect of the present disclosure relates to a method for forming a polycrystalline silicon film. The method includes (i) forming a first amorphous silicon film (seed layer 121) in a substrate 100, (ii) forming a second amorphous silicon film (bulk layer 122) that covers the first amorphous silicon film, and (iii) heating the substrate 100.

The forming of the first amorphous silicon film in the substrate 100 includes performing a deposition process under the process condition of (a) and (b) below, while supplying monosilane ($SiH_4$) gas into a processing chamber 10 that accommodates the substrate 100.

(a) Setting a temperature in the processing chamber 10 to be in the range of greater than or equal to 300° C. and less than or equal to 440° C.

(b) Setting a pressure of the processing chamber 10 to be in the range of greater than or equal to 10 Torr and less than or equal to 100 Torr.

With this approach, in the method for forming a polycrystalline silicon film, a first amorphous silicon film having a more uniform film thickness can be formed in a substrate 100.

The forming of a second amorphous silicon film (bulk layer 122) is performed at a high temperature and a low pressure, compared to the forming of a first amorphous silicon film (seed layer 121) in a substrate 100. With this approach, in the method for forming a polycrystalline silicon film, the bulk layer 122 can be efficiently formed on the seed layer 121.

The forming of a second amorphous silicon film (bulk layer 122) includes performing a film deposition process under the process condition of (d) and (e) below, while supplying monosilane ($SiH_4$) gas into a processing chamber 10.

(d) Setting a temperature in a processing chamber 10 to be in the range of greater than or equal to 450° C. and less than or equal to 530° C.

(e) Setting a pressure of a processing chamber 10 to 5 Torr or less.

With this approach, in the method for forming a polycrystalline silicon film, a second amorphous silicon film having a desired film thickness can be stably formed on a first amorphous silicon film (seed layer 121).

While certain embodiments are described using the film deposition method and the method for forming a polycrystalline silicon film, these embodiments are presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the scope of the disclosures. The accompanying claims and their equivalents are intended to cover such forms or modifications as would fall within the scope of the disclosures.

The above embodiments are described using a case where the processing apparatus is a batch-type apparatus in which substrates are processed at the same time. However, the present disclosure is not limited to the above type. For example, the processing apparatus may be a single-substrate processing apparatus in which substrates are processed one by one.

According to the above embodiments, an amorphous silicon film having a more uniform film thickness is capable of being formed.

What is claimed is:

1. A film deposition method comprising:
depositing an amorphous silicon film in a substrate under a process condition, the process condition including
supplying $SiH_4$ gas into a processing chamber in which the substrate is placed,
setting a temperature in the processing chamber to be in a range of greater than or equal to 300° C. and less than or equal to 440° C., and setting a pressure in the processing chamber to be in a range of greater than or equal to 10 Torr and less than or equal to 100 Torr, the amorphous silicon film including a seed layer that is derived from the $SiH_4$ gas, and the seed layer being deposited under the process condition;

depositing a bulk layer on the seed layer; and desorbing hydrogen from the seed layer derived from the $SiH_4$ gas to crystallize the seed layer and the bulk layer, wherein the depositing of the amorphous silicon film includes nucleating silicon in the seed layer within the ranges of the temperature and the pressure in the processing chamber, wherein the crystallizing of the seed layer and the bulk layer includes crystallizing the bulk layer from the nucleated silicon, wherein the substrate includes a top surface and a recess extending from the top surface in a depth direction, wherein the depositing of the amorphous silicon film includes depositing the seed layer on which the bulk layer is to be deposited, on the top surface and an inner surface of the recess in the substrate, and wherein the process condition is adjusted such that a thickness ratio of the seed layer at a bottom surface of the recess to the seed layer at the top surface of the substrate is 97.7%.

2. The film deposition method according to claim 1, wherein the process condition includes setting a flow rate of the $SiH_4$ gas supplied into the processing chamber to be in a range of greater than or equal to 0.1 slm and less than or equal to 3 slm.

3. The film deposition method according to claim 1, wherein the substrate includes a flat portion, the flat portion being flat and continuous along a plane of the substrate, and wherein in the depositing of the amorphous silicon film, the seed layer is deposited on the flat portion.

4. The film deposition method according to claim 3, wherein the recess in the substrate is recessed from the flat portion in a thickness direction of the substrate, and wherein in the depositing of the amorphous silicon, the seed layer is deposited on each of the flat portion and the recess.

5. The film deposition method according to claim 1, further comprising:

forming an insulating film in the substrate, wherein in the depositing of the amorphous silicon film, the seed layer is deposited on the insulating film.

6. A method for forming a polycrystalline silicon film comprising:

forming a first amorphous silicon film in a substrate under a process condition, the process condition including supplying $SiH_4$ gas into a processing chamber in which the substrate is placed, setting a first temperature in the processing chamber to be in a range of greater than or equal to 300° C. and less than or equal to 440° C., and setting a first pressure of the processing chamber to be in a range of greater than or equal to 10 Torr and less than or equal to 100 Torr, the first amorphous silicon film including a seed layer that is derived from the $SiH_4$ gas, and the seed layer being deposited under the process condition;

forming a bulk layer to cover the first amorphous silicon film; and heating the substrate including the seed layer and the bulk layer, the heating including desorbing hydrogen from the seed layer derived from the $SiH_4$ gas to crystallize the seed layer and the bulk layer, wherein the depositing of the first amorphous silicon film includes nucleating silicon in the seed layer within the ranges of the first temperature and the first pressure in the processing chamber, wherein the crystallizing of the seed layer and the bulk layer includes crystallizing the bulk layer from the nucleated silicon, wherein the substrate includes a top surface and a recess extending from the top surface in a depth direction, wherein the depositing of the amorphous silicon film includes depositing the seed layer on which the bulk layer is to be deposited, on the top surface and an inner surface of the recess in the substrate, and wherein the process condition is adjusted such that a thickness ratio of the seed layer at a bottom surface of the recess to the seed layer at the top surface of the substrate is 97.7%.

7. The method according to claim 6, wherein the forming of the bulk layer is performed at a second temperature in the processing chamber and at a second pressure of the processing chamber, the second temperature being greater than the first temperature used in the forming of the first amorphous silicon film, and the second pressure being less than the first pressure used in the forming of the first amorphous silicon film.

8. The method according to claim 7, wherein the forming of the bulk layer is performed under a second process condition, the second process condition including supplying the $SiH_4$ gas into the processing chamber, setting the second temperature in the processing chamber to be in a range of greater than or equal to 450° C. and less than or equal to 530° C., and setting the second pressure of the processing chamber to be in a range of 5 Torr or less.

* * * * *